United States Patent
Yu et al.

(10) Patent No.: US 8,306,498 B2
(45) Date of Patent: Nov. 6, 2012

(54) WIDEBAND RECEIVER

(75) Inventors: Hyun Kyu Yu, Daejeon (KR); Joon Hee Lee, Seoul (KR); Seong Hwan Cho, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 78 days.

(21) Appl. No.: 12/970,874

(22) Filed: Dec. 16, 2010

(65) Prior Publication Data
US 2011/0135045 A1   Jun. 9, 2011

(30) Foreign Application Priority Data

Dec. 18, 2009 (KR) .................. 10-2009-0127546
Apr. 19, 2010 (KR) .................. 10-2010-0035945

(51) Int. Cl.
*H04B 1/18* (2006.01)
*H04K 3/00* (2006.01)
(52) U.S. Cl. ....................... 455/285; 455/302
(58) Field of Classification Search ............ 375/324; 455/285, 296, 302, 306, 313, 323–324; 341/155, 341/157
See application file for complete search history.

(56) References Cited

U.S. PATENT DOCUMENTS

| | | | |
|---|---|---|---|
| 5,108,334 A | 4/1992 | Eschenbach et al. | |
| 5,557,642 A * | 9/1996 | Williams | 375/316 |
| 2005/0221784 A1 | 10/2005 | Gomez et al. | |
| 2006/0160518 A1 * | 7/2006 | Seendripu et al. | 455/323 |
| 2007/0140382 A1 * | 6/2007 | Qian | 375/332 |

OTHER PUBLICATIONS

Chun-Huat Heng et al., "A CMOS TV Tuner/Demodulator IC With Digital Image Rejection", IEEE Journal of Solid-State Circuits, Dec. 2005, pp. 2525-2535, vol. 40, No. 12, IEEE.
Larry Connell et al., "A CMOS Broadband Tuner IC", IEEE ISSCC, 2002, pp. 400-401, Session 24, RF Systems, 24.3, IEEE.
Sanggyu Sim et al., "A Three-Band-Tuner for Digital Terrestrial and Multistandard Reception", IEEE Transactions on Consumer Electronics, Aug. 2002, pp. 709-717, vol. 48, No. 3, IEEE.
Jan Van Sinderen et al., "A 48-860MHz Digital Cable Tuner IC with Integrated RF and IF Selectivity", IEEE ISSCC, 2003, pp. 210-211, Session 25, RF Infotainment, Paper 25.3, IEEE.

* cited by examiner

*Primary Examiner* — Lee Nguyen

(57) ABSTRACT

Provided is a wideband receiver that has a smaller area and consumes less power and can prevent harmonic mixing occurring due to an increase in the number of communications systems using wideband. A wideband receiver according to an aspect of the invention may include: an front-end unit receiving and performing low-pass filtering on a wideband input signal in a continuous-time domain; and a down-conversion unit sampling and holding an output signal of the front-end unit according to a local oscillator signal and performing low-pass filtering on the output signal in a discrete tie domain.

16 Claims, 8 Drawing Sheets

WIDEBAND RECEIVER

CROSS-REFERENCE TO RELATED APPLICATIONS

This application claims the priority of Korean Patent Application Nos. 10-2009-0127546 filed on Dec. 18, 2009, and 10-2010-0035945 filed on Apr. 19, 2010, in the Korean Intellectual Property Office, the disclosures of which are incorporated herein by reference.

BACKGROUND OF THE INVENTION

1. Field of the Invention

The present invention relates to wideband receivers, and more particularly, to a wideband receiver that has a smaller area and consumes less power and can prevent harmonic mixing occurring due to an increase in the number of communications systems using wideband.

2. Description of the Related Art

An application using wideband, such as a digital TV, frequently undergoes harmonic mixing as shown in FIGS. 1A, 1B and 1C.

As shown in FIG. 1A, as for wideband applications, undesirable signals are present at frequencies three or five times the magnitude of a carrier frequency of an input signal (an RF signal). By a frequency three or five times the magnitude of a frequency of a local oscillator (LO) signal, shown in FIG. 1B, these signals are moved down to baseband frequencies together with a desired signal when the frequency of the desired signal is down-converted to baseband by a down-conversion mixer, which is illustrated in FIG. 1C.

In order to solve the above-described problem of harmonic mixing, in the related art, a dual conversion receiver has been used.

As shown in FIG. 2, a dual conversion receiver amplifies an input signal RFin by a wideband low-noise amplifier (hereinafter, referred to as an "LNA") 211 and up-converts the amplified input signal to high intermediate frequency (IF) by an up-conversion mixer 212. The input signal being up-converted is filtered through a narrowband surface acoustic wave (SAW) filter 213, is then moved to low IF by down-conversion mixers 221 and 222, and is finally output via IF variable gain amplifiers (hereinafter, referred to as "VGAs") 223 and 224 and low pass filters (hereinafter, referred to as "LPFs") 225 and 226.

However, the dual conversion receiver having the above-described configuration and performing the above-described operation has various problems as follows.

First, the use of additional external components, such as the narrowband SAW filter 213, causes an increase in manufacturing costs.

Besides, unlike existing receivers, the dual conversion receiver requires two frequency synthesizers 214 and 228 and two or more mixers, that is, the up-conversion mixer 212 and the down-conversion mixers 221, and 222, thereby increasing the size of the receiver and the amount of power being consumed.

In order to solve these problems of the dual conversion receiver, in the related art, another receiver that includes a harmonic suppression mixer having a plurality of mixers connected in parallel with each other was additionally proposed.

However, since the harmonic suppression mixer has a larger area and consumes more power than existing mixers, the area and power consumption of the receiver having the harmonic suppression mixer therein are therefore increased.

Besides, the harmonic suppression mixer requires a plurality of multi-phase local oscillator signals, and accurate phase differences need to exist between the plurality of local oscillator signals. For this reason, additional circuits need to be added in order to control the phase differences between the plurality of local oscillator signals, which result in the receiver having a higher area and high power consumption.

SUMMARY OF THE INVENTION

An aspect of the present invention provides a wideband receiver having new architecture that has a smaller area and consumes less power and can prevent harmonic mixing occurring due to an increase in the number of communications systems using wideband.

According to an aspect of the present invention, there is provided a wideband receiver including: an front-end unit receiving and performing low-pass filtering on a wideband input signal in a continuous-time domain; and a down-conversion unit sampling and holding an output signal of the front-end unit according to a local oscillator signal and performing low-pass filtering on the output signal in a discrete tie domain.

The front-end unit may include: a wideband low-noise amplifier receiving and amplifying the wideband input signal; and at least one tunable low pass filter changing cutoff frequency according to a frequency of the wideband input signal and performing low-pass filtering on the wideband input signal.

The at least one tunable low pass filter may include: first and second resistors connected in series between an input terminal and an output terminal; a first capacitor connected between a ground and a contact point between the output terminal and the second resistor; a second capacitor and an output resistor connected between the ground and a contact point between the first resistor and the second resistor; and a buffer connected between the output terminal and a contact point between the second capacitor and the output resistor.

The buffer may be configured as an operational amplifier having a gain of 1.

The at least one tunable low pass filter may change the cutoff frequency by changing a device value of at least one of the first and second resistors and the first and second capacitors.

The at least tunable low pass filter further may include: a first transistor of a first conductivity type having a gate connected to the input terminal and a source to which a driving voltage is applied; a first transistor of a second conductivity type having a gate and a drain connected in common to a drain of the first transistor of the first conductivity type; and a second transistor of a first conductivity having a gate and a drain connected in common to the output terminal and a source connected to the driving voltage terminal.

The buffer may be configured as a second transistor of a second conductivity type having a gate connected to the first capacitor, a drain connected to the drain of the second transistor of the first conductivity type, and a source connected to the second capacitor.

The down-conversion unit may include: a clock generator generating a clock; a phase shifter shifting a clock with a phase difference of 90° to thereby generate the local oscillator signal required to restore an I/Q signal; two sample and hold circuits sampling and holding the output signal of the front-end unit according to the local oscillator signal in the discrete-time domain, down-converting the output signal of the front-end unit to baseband, and converting the output signal into a signal in the discrete-time domain; and two discrete-time low pass filters performing low-pass filtering on respective outputs of the two sample and hold circuits in the discrete-time domain.

Each of the two sample and hold circuits may include: a first transistor having a drain connected to a first input terminal and a gate to which a local oscillator signal is input; a second transistor having a drain connected to a second input terminal and a gate to which the local oscillator signal is input; a third transistor having a drain connected to a source of the first transistor, a gate to which an inverted local oscillator signal is input, and a source connected to an output terminal; a fourth transistor having a drain connected to a source of the second transistor, a gate to which the inverted local oscillator signal is input, and a source connected to a bias voltage; a fifth transistor having a drain connected to the output terminal and a gate to which the local oscillation signal is input; a first capacitor connected between the source of the first transistor and the source of the second transistor; a second capacitor connected between the output terminal and a source of the fifth transistor; and a third capacitor connected between the second capacitor and a ground.

The two sample and hold circuits may receive respective output signals of the front-end unit in the form of a differential signal pair through the first and second input terminals.

The clock generator may vary a frequency of the clock.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

As the present invention allows for various changes and numerous embodiments, particular embodiments will be illustrated in drawings and described in detail in the written description.

However, this is not intended to limit the present invention to particular modes of practice, and it is to be appreciated that all changes, equivalents, and substitutes that do not depart from the spirit and technical scope of the present invention are encompassed in the present invention.

While such terms as "first" and "second," etc., may be used to describe various components, such components must not be limited to the above terms. The above terms are used only to distinguish one component from another. For example, a first component may be referred to as a second component without departing from the scope of the rights of the present invention, and likewise, a second component may be referred to as a first component.

When a component is mentioned to be "connected" to or "accessing" another component, this may mean that it is directly connected to or accessing the other component, but it is to be understood that another component may exist in-between. On the other hand, when a component is mentioned as being "directly connected" to or "directly accessing" another component, it is to be understood that there are no other components in-between.

The terms used in the present application are merely used to describe particular embodiments, and are not intended to limit the present invention. An expression used in the singular encompasses the expression of the plural, unless it has a clearly different meaning in the context. In the present application, it is to be understood that the terms such as "including" or "having," etc., are intended to indicate the existence of the features, numbers, operations, actions, components, parts, or combinations thereof disclosed in the specification, and are not intended to preclude the possibility that one or more other features, numbers, operations, actions, components, parts, or combinations thereof may exist or may be added.

Unless otherwise defined, all terms used herein, including technical or scientific terms, have the same meanings as those generally understood by those with ordinary knowledge in the field of art to which the present invention belongs. Such terms as those defined in a generally used dictionary are to be interpreted to have meanings equal to the contextual meanings in the relevant field of art, and are not to be interpreted to have ideal or excessively formal meanings unless clearly defined in the present application.

Embodiments of the present invention will be described below in detail with reference to the accompanying drawings, where those components are rendered the same reference number that are the same or correspond to, regardless of the figure number, and redundant explanations are omitted.

Figure 1A:
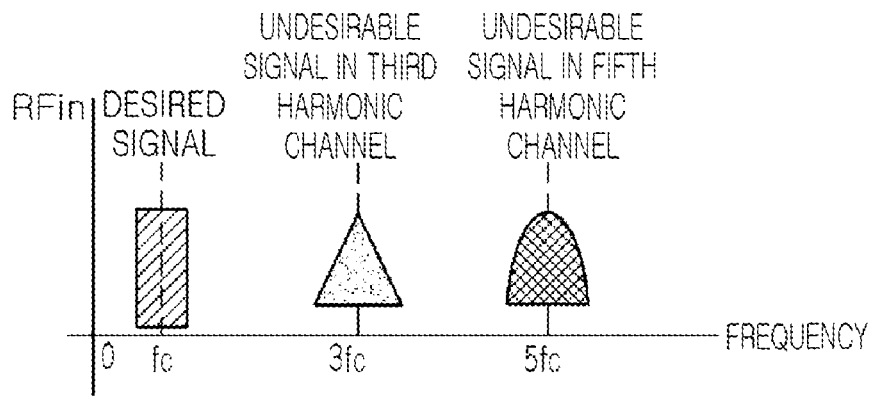
FIGS. 1A, 1B, and 1C are views illustrating harmonic mixing.
Figure 1B:
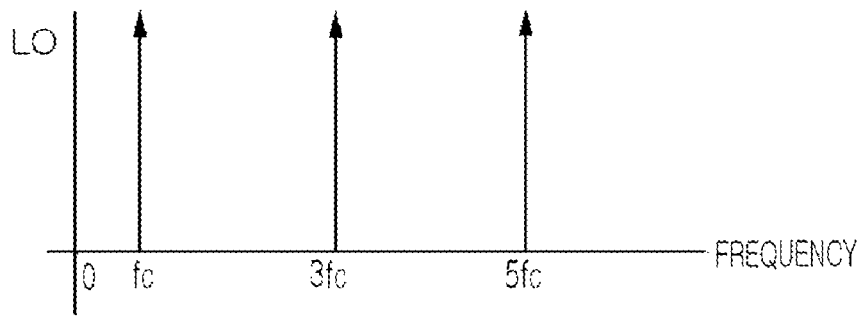
Figure 1C:
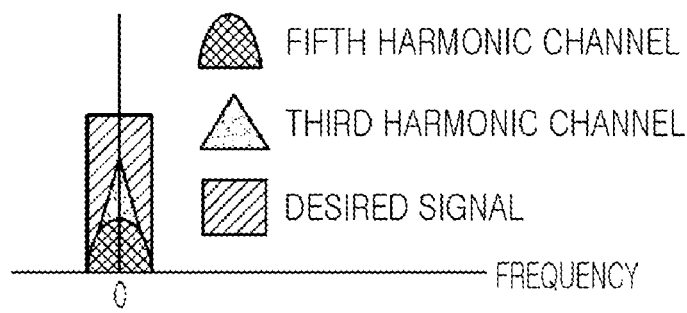
Figure 2:
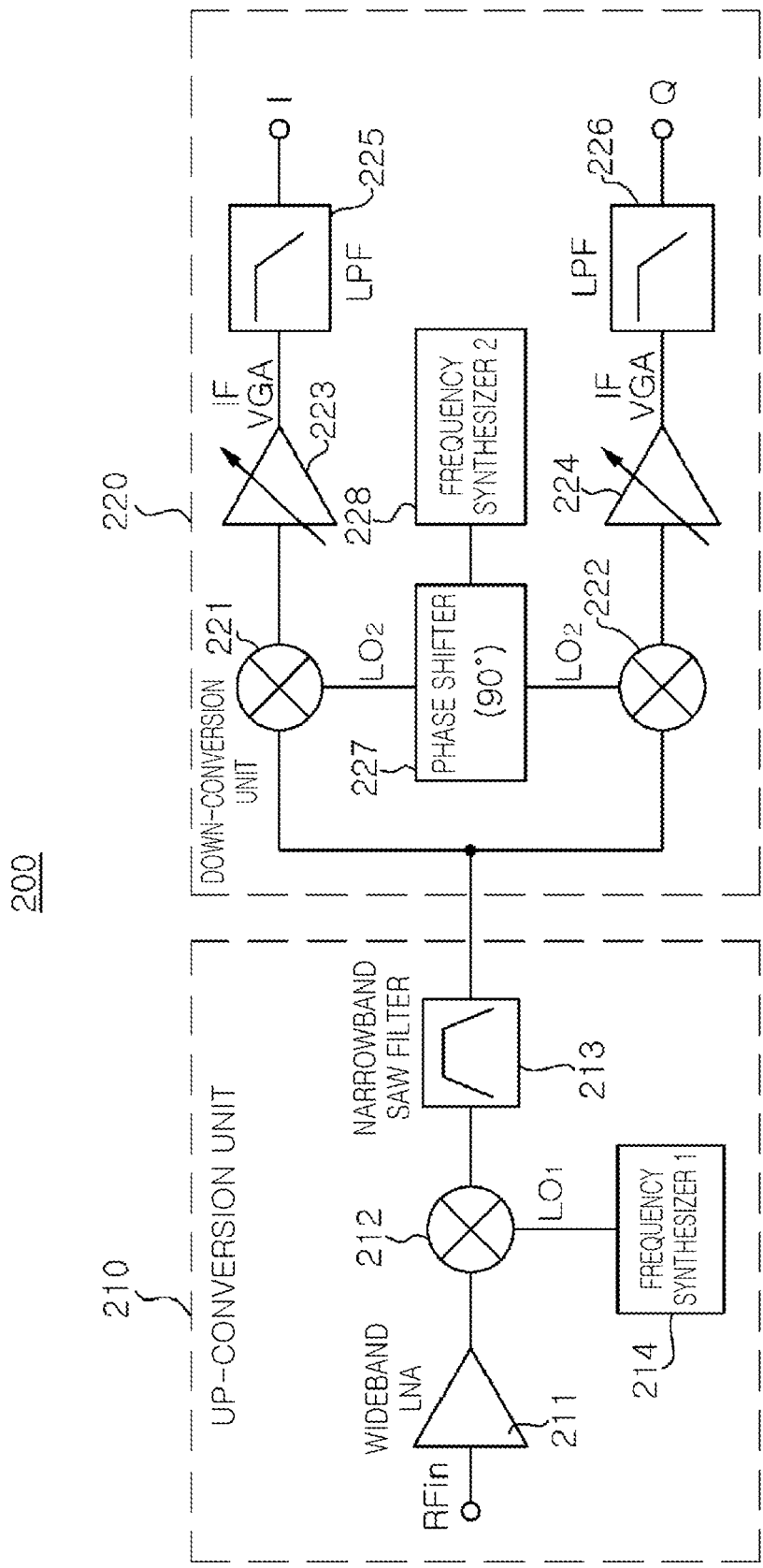
FIG. 2 is a view illustrating a dual conversion receiver according to the related art.
Figure 3:
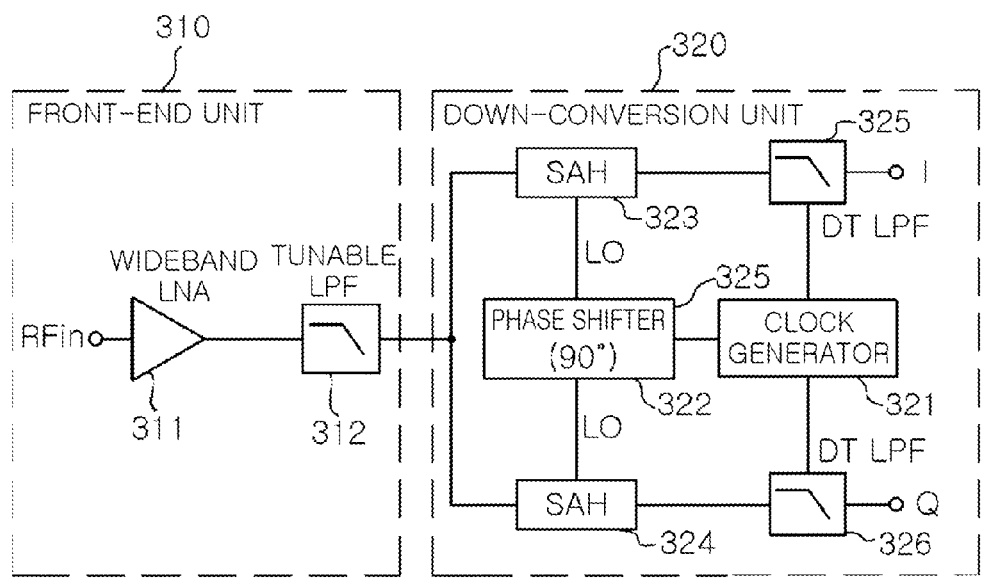
FIG. 3 is a view illustrating a wideband receiver according to an exemplary embodiment of the present invention.

FIG. 3 is a view illustrating a wideband receiver according to an exemplary embodiment of the invention.

Referring to FIG. 3, a wideband receiver according to this embodiment includes an front-end unit 310 and a down-conversion unit 320. The front-end unit 310 receives and performs low-pass filtering on a wideband input signal in the continuous-time domain. The down-conversion unit 320 samples and holds an output signal from the front-end unit 310 according to a local oscillator signal and performs low-pass filtering on the output signal in the discrete-time domain.

The front-end unit 310 includes a wideband LNA 311 and a tunable low pass filter (hereinafter, referred to as a "tunable LPF") 312. The wideband LNA 311 receives and amplifies the wideband input signal RFin. The tunable LPF 312 can change cutoff frequency and performs low-pass filtering on the input signal according to the cutoff frequency in the continuous-time domain.

Here, the tunable LPF 312 may be a high pass filter in order to remove signals present at frequencies higher than a desired frequency to thereby prevent harmonic mixing. Furthermore, since the amplitude of an undesirable signal cannot be reduced to a desired level or less unless the cutoff frequency (or 3 dB frequency) is changed according to the frequency of the input signal RFin, the cutoff frequency can be changed according to the frequency of the input signal RFin.

The down-conversion unit 320 includes a clock generator 321, a phase shifter 322, two sample and hold circuits (hereinafter, referred to as "SAH circuits") 323 and 324, and discrete-time low pass filters (hereinafter, referred to as "DT LPFs") 325 and 326. The clock generator 321 generates a clock. The phase shifter 322 shifts the clock with a phase difference of 90° to thereby generate a local oscillator signal LO required to restore an I/Q signal. The SAH circuits 323 and 324 each sample and hold a signal, being output from the front-end unit 310, according to the local oscillator signal LO in the discrete-time domain, down-convert the signal to baseband, and then convert the signal to a signal in the discrete-time domain. The DT LPFs 325 and 326 perform low-pass filtering on respective outputs from the SAH circuits 323 and 324 in the discrete-time domain. Here, according to the known art, the DT LPFs 325 and 326 may be IIR (infinite impulse response) filters or FIR (finite impulse response) filters. A detailed description thereof will be omitted.

That is, as the down-conversion unit 320 uses the SAH circuits 323 and 324 and the DT LPFs 325 and 326 that are operable in the discrete-time domain, the down-conversion unit 320 can be operated in the discrete-time domain. Here, the operating characteristics of the down-conversion unit 320 can be varied by changing the frequency of the clock, being generated by the clock generator 321. In particular, the filtering characteristics of the DT LPFs 325 and 326 can be easily changed according to the frequency of the clock, so that the wideband receiver according to the exemplary embodiment of the invention can be used in various manners in another applications as well as digital TVs.

Furthermore, the DT LPFs 325 and 326 also serve as decimation filters used to reduce respective sampling frequencies of the SAH circuits 323 and 324. In comparison with LPFs operating in the continuous-time domain, the DT LPFs 325 and 326 are less sensitive to process, voltage and temperature variations, thereby increasing the reliability of the operation of the wideband receiver.

Figure 4:
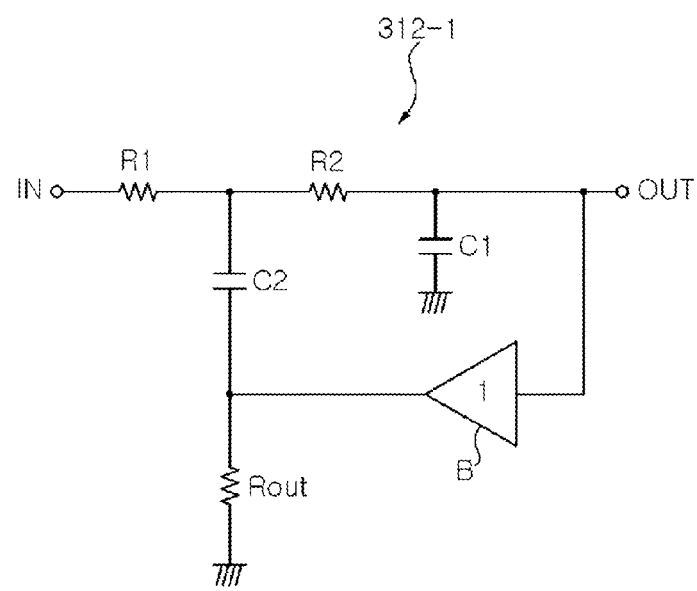
FIG. 4 is a view illustrating a tunable LPF according to an exemplary embodiment of the present invention.

FIG. 4 is a view illustrating a tunable LPF according to an exemplary embodiment of the invention.

As shown in FIG. 4, a tunable LPF 312-1 has a structure of a Sallen-Key filter. More specifically, the tunable LPF 312-1 includes first and second resistors R1 and R2 connected in series between an input terminal IN and an output terminal OUT, a first capacitor C1 connected between a ground and a contact point between the output terminal OUT and the second resistor R2, a second capacitor C2 and an output resistor Rout connected in series between the ground and a contact point between the first resistor R1 and the second resistor R2, and a buffer B connected between the output terminal OUT and a contact point between the second capacitor C2 and the output resistor Rout. Here, the buffer B may be configured as an operational amplifier having a gain of "1".

The tunable LPF having the above-described configuration determines the cutoff frequency fcutoff according to Equation 1.

$$f_{cutoff} = \frac{1}{2\pi\sqrt{C1 C2 R1 R2}} \quad \text{Equation 1}$$

Referring to Equation 1, it can be seen that the cutoff frequency fcutoff of the tunable LPF is determined by device values of the first and second resistors R1 and R2 and the first and second capacitors C1 and C2.

In the present invention, therefore, at least one of the first and second resistors R1 and R2 and the first and second capacitors C1 and C2 is realized as an array or variable device, and a device value thereof is changed according to the frequency of the input signal RFin, so that the cutoff frequency fcutoff is finally changed.

Generally, when both the input and output of the LPF are voltages, linearity in a low frequency band may be reduced. In particular, since the V-I characteristic of the transistor is not linear, if V-I conversion continues to be performed, the linearity in the low frequency band can be further reduced.

Figure 5:
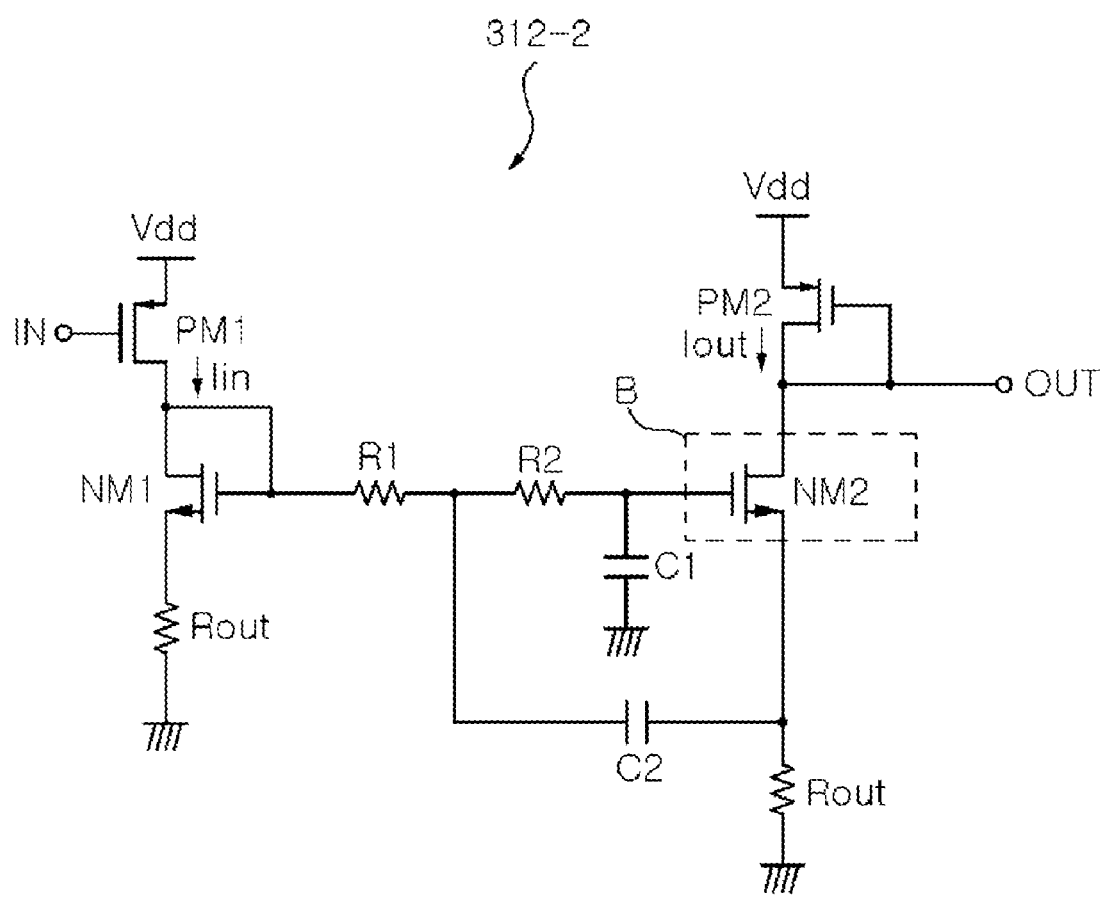
FIG. 5 is a view illustrating a tunable LPF according to another exemplary embodiment of the present invention.

Thus, in the present invention, as shown in FIG. 5, components are added in order to convert voltages at the input terminal IN and the output terminal OUT of the tunable LPF, shown in FIG. 4, into currents, so that the input of the LPF is changed into a current.

FIG. 5 is a view illustrating a tunable LPF according to another exemplary embodiment of the invention.

Referring to FIG. 5, a tunable LPF 312-2 includes the first through third output resistors R1, R2, and Rout, the first and second capacitors C1 and C2, and the buffer B as shown in FIG. 4. The tunable LPF 312-2 further includes a first PMOS transistor PM1, a first NMOS transistor NM1, an output resistor Rout, and a second PMOS transistor PM2. The first PMOS transistor PM1 has a gate connected to an input terminal IN and a source to which a driving voltage Vdd is applied. The first NMOS transistor NM1 has a gate and a drain connected in common to a drain of the first PMOS transistor PM1. The output resistor Rout is connected to a source of the first NMOS transistor NM1. The second PMOS transistor PM2 has a gate and a drain connected in common to an output terminal OUT and a source connected to a driving voltage Vdd terminal.

That is, as the first PMOS transistor PM1 and the first NMOS transistor NM1 are added to the input terminal IN of the tunable LPF 312-2, shown in FIG. 5, and the second PMOS transistor PM2 is added to the output terminal OUT thereof, the tunable LPF 312-2 converts an input voltage and an output voltage into an input current and an output current, respectively, by using the added components.

Furthermore, as shown in FIG. 5, the buffer B, shown in FIG. 4, may be realized as a second NMOS transistor NM2 having a gate connected to the first capacitor C1, a drain connected to the drain of the second PMOS transistor PM2, and a source connected to the second capacitor C2. Basically, a transistor can be driven using power smaller than that of an operational amplifier, in the case that a buffer of the operational amplifier is replaced with a transistor, the amount of power being consumed by the tunable LPF can be reduced.

Figure 6:
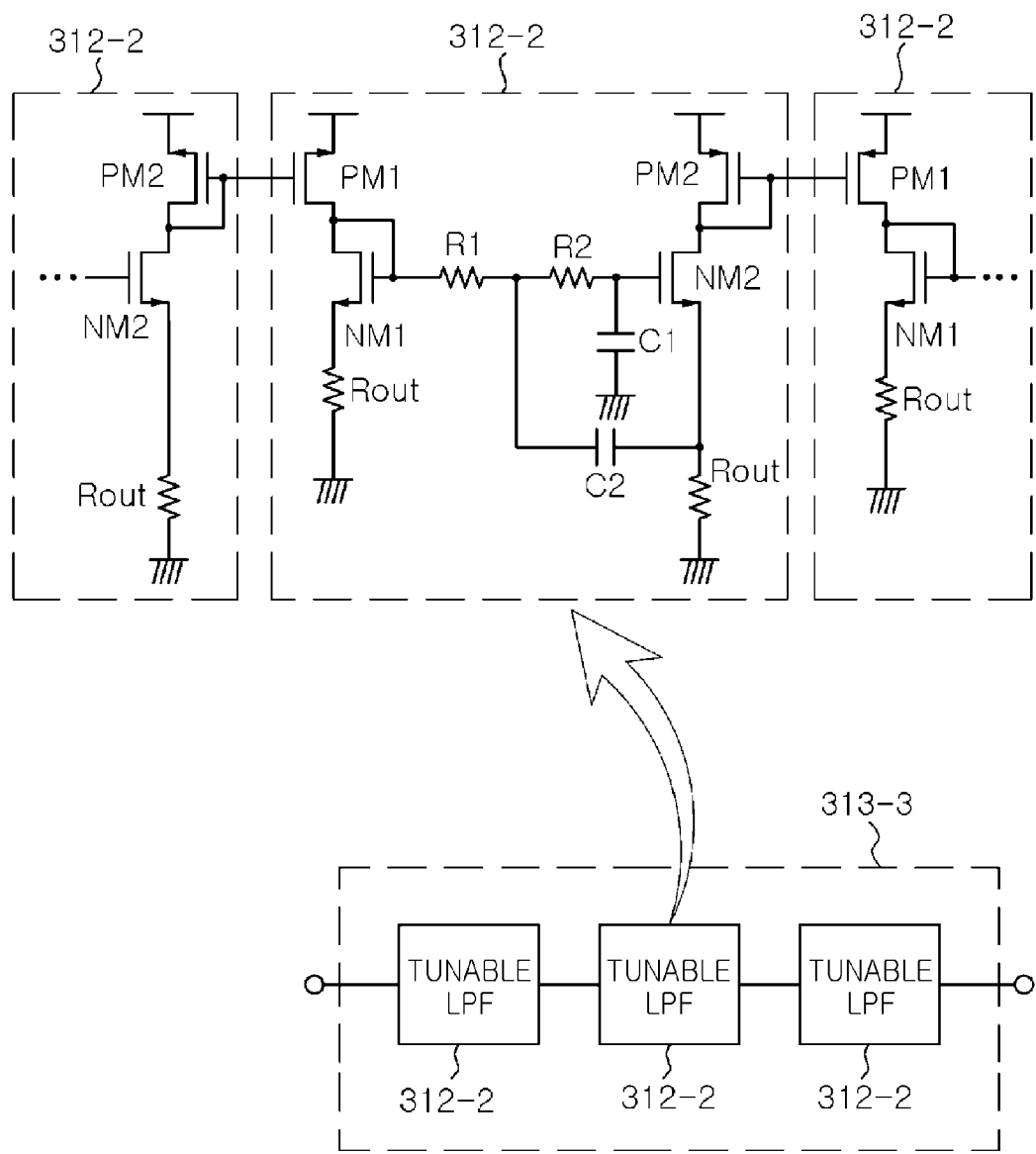
FIG. 6 is a view illustrating a tunable LPF according to another exemplary embodiment of the present invention.

Furthermore, when a rejection ratio of the tunable LPF having the configuration as shown in FIGS. 4 and 5 is not high enough, a plurality of tunable LPFs are connected in series with each other as shown in FIG. 6, so that a rejection ratio with respect to an undesirable signal can be improved.

FIG. 6 is a view illustrating a tunable LPF according to another exemplary embodiment of the invention.

Referring to FIG. 6, a tunable LPF 312-3 has a plurality of tunable LPFs 312-2 as shown in FIG. 4 or FIG. 5, connected in series with each other.

When the tunable LPFs, shown in FIG. 6, are configured using the tunable LPFs 312-2 as shown in FIG. 5, a second PMOS transistor PM2 of the tunable LPF 312-2, provided at a front stage, and a first PMOS transistor PM1 of the tunable LPF 312-2, provided at a rear stage, are connected in a current mirror configuration. As a result, an output current of the tunable LPF 312-2, provided at the front stage, is thereby applied as an input current of the tunable LPF 312-2, provided at the rear stage.

Figure 7A:
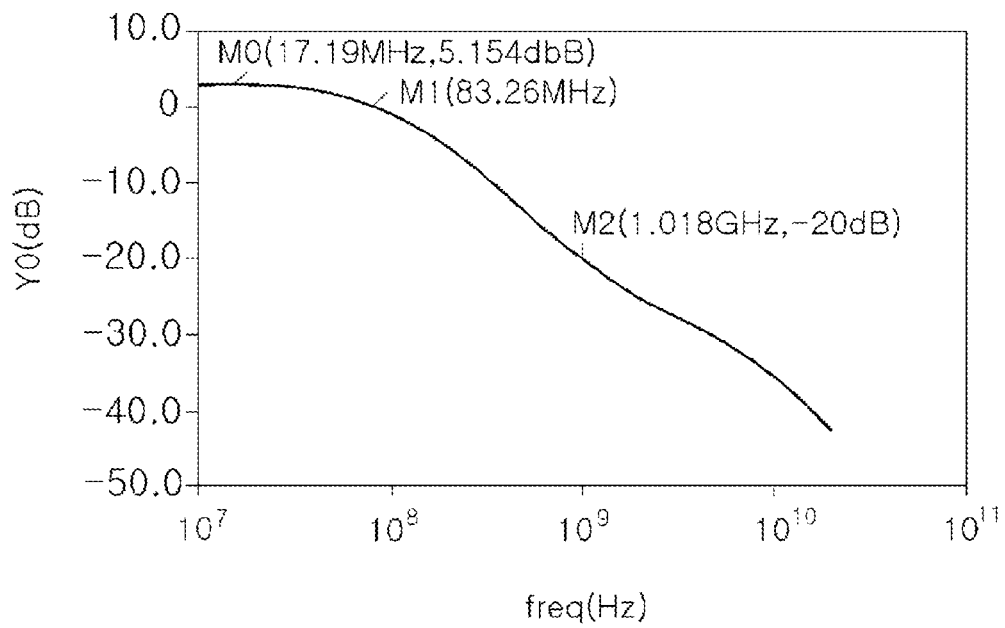
FIGS. 7A and 7B are graphs illustrating the filter characteristics of the tunable LPF of FIG. 5.
Figure 7B:
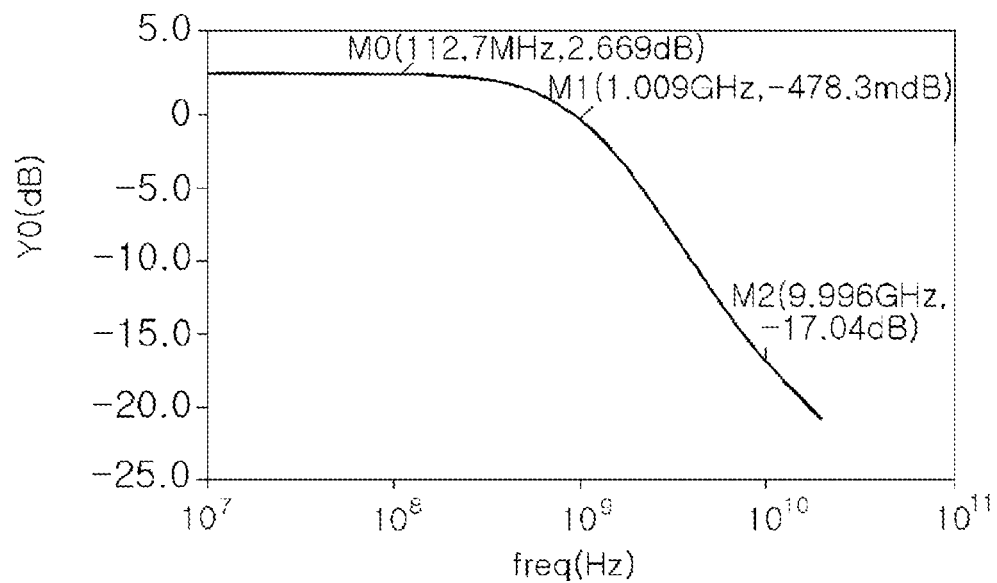
Figure 8A:
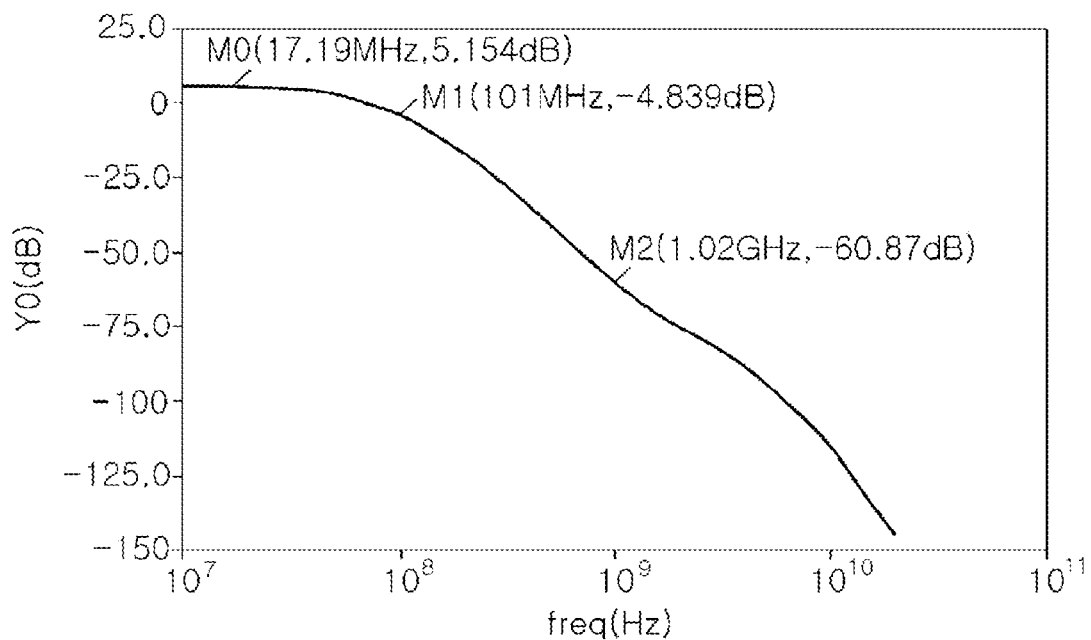
FIGS. 8A and 8B are graphs illustrating the filter characteristics of the tunable LPF of FIG. 6.
Figure 8B:
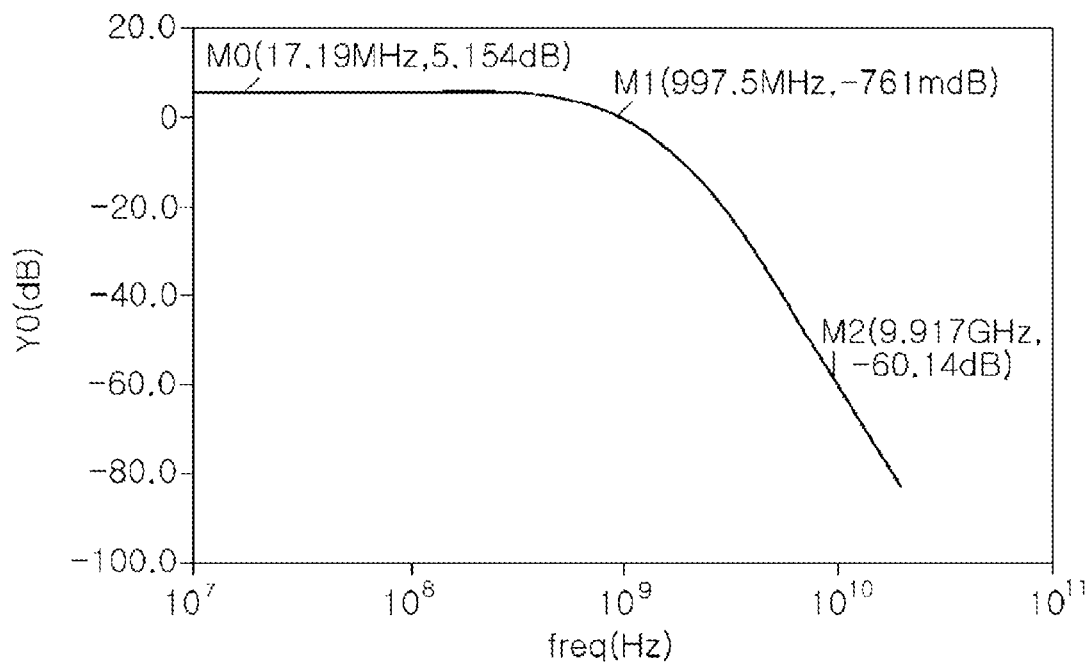

FIGS. 7A and 7B are views illustrating the filter characteristics of the tunable LPF as shown in FIG. 5. FIGS. 8A and 8B are views illustrating the filter characteristics of the tunable LPF as shown in FIG. 6.

As shown in FIGS. 7A and 7B and 8A and 8B, a tunable LPF according to an exemplary embodiment of the invention can optionally control the cutoff frequency by changing device values of resistors and capacitors. That is, as shown in FIGS. 7A and 7B and 8A, a cutoff frequency may be set to 80 MHz. Alternatively, as shown in FIGS. 7A and 7B and 8B, a cutoff frequency may be set to 1 GHz.

Through a comparison between the drawings of FIGS. 7A and 7B and FIGS. 8A and 8B, it can be seen that the tunable LPFs, shown in FIG. 6, have a higher rejection ratio than the tunable LPF, shown in FIG. 5. That is, by connecting the tunable LPFs, as shown in FIG. 5, in series with each other, a rejection ratio with respect to an undesirable signal can be increased.

Figure 9:
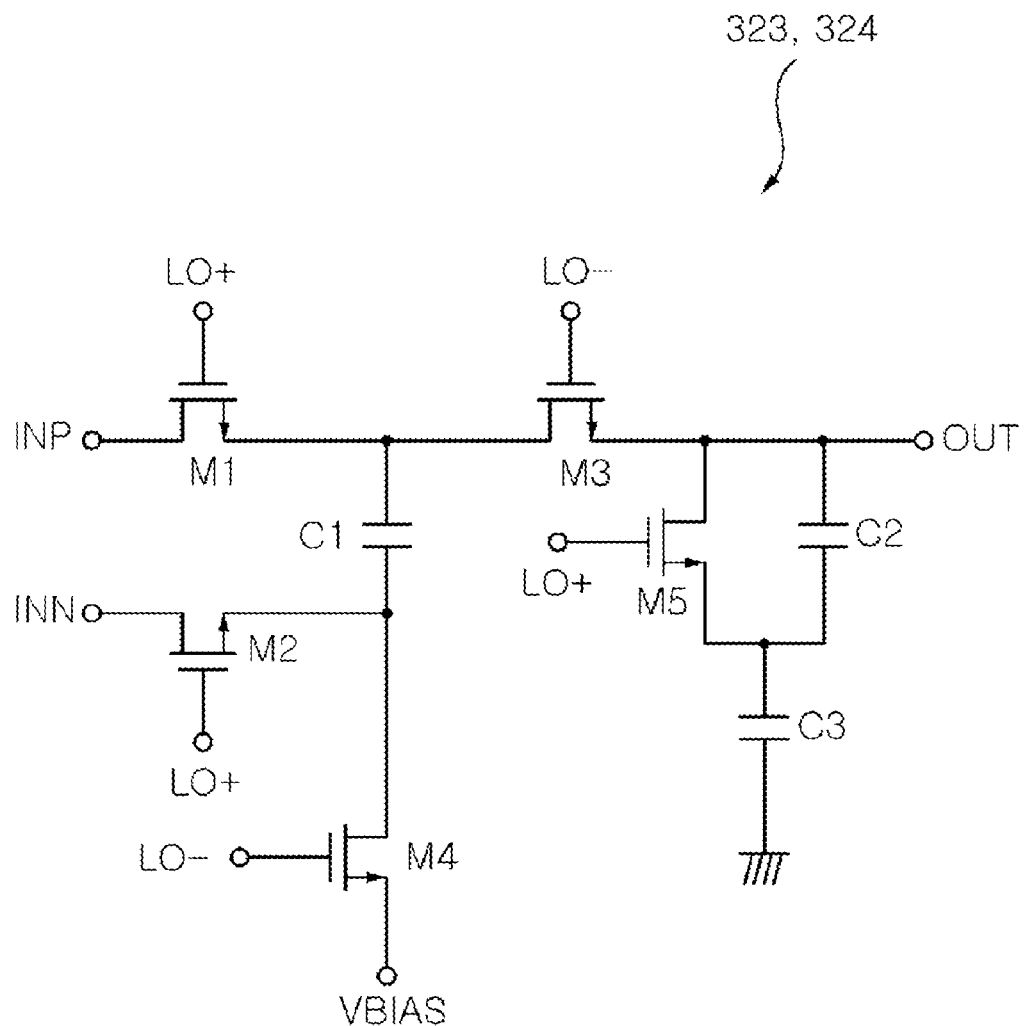
FIG. 9 is a view illustrating a sample and hold circuit according to an exemplary embodiment of the present invention.

FIG. 9 is a view illustrating an SAH circuit according to an exemplary embodiment of the invention.

As shown in FIG. 9, each of the SAH circuits 323 and 324 includes a first transistor M1, a second transistor M2, a third transistor M3, a fourth transistor M4, a fifth capacitor M5, a first capacitor C1, a second capacitor C2, and a third capacitor C3. The first transistor M1 has a drain connected to a first input terminal INP and a gate to which a local oscillator signal LO+ is input. The second transistor M2 has a drain connected to a second input terminal INN and a gate to which a local oscillator signal LO+ is input. The third transistor M3 has a drain connected to a source of the first transistor M1, a gate to which an inverted local oscillator signal LO− is input, and a source connected to an output terminal OUT. The fourth transistor M4 has a drain connected to a source of the second transistor M2, a gate to which the inverted local oscillator signal LO− is input, and a source connected to a bias voltage VBIAS terminal. The fifth transistor M5 has a drain connected to the output terminal OUT and a gate to which the local oscillator signal LO+ is input. The first capacitor C1 is connected between the source of the first transistor M1 and the source of the second transistor M2. The second capacitor C2 is connected between the output terminal OUT and a source of the fifth capacitor M5. The third capacitor C3 is connected between the second capacitor C2 and a ground. Here, the SAH circuit has a differential structure receiving an output of the tunable LPF 312 and a local oscillator signal from the phase shifter 322 in the form of a differential signal pair.

Hereinafter, the operation of the SAH circuit will be described.

First, when a local oscillator signal pair consisting of a local oscillator signal LO+ and an inverted local oscillator signal LO− and having a first value is applied (for example, a local oscillator signal LO+ has a high level and an inverted local oscillator signal LO− is a low level), the first, second, and fifth capacitors M1, M2, and M5 are turned on, and the third and fourth transistors M3 and M4 are turned off. Both ends of the first capacitor C1 are then connected to the first and second input terminals INP and INN, respectively, a signal value of the input signal pair is stored in the first capacitor C1.

Subsequently, when a local oscillator signal pair consisting of a local oscillator signal LO+ and an inverted local oscillator signal LO− and having a second value is applied (for example, the local oscillator signal LO has a low level, and the inverted local oscillator signal LO− has a high level), the first, second, and fifth capacitors M1, M2, and M5 are turned off, and the third and fourth transistors M3 and M4 are turned on.

The signal value of the input signal pair, stored in the first capacitor C1, is finally output to the third transistor M3 and the second capacitor C2.

That is, the SAH circuit, as shown in FIGS. 8A and 8B, samples the signal value of the input signal pair in a half period of the local oscillator signal pair consisting of the local oscillator signal LO+ and the inverted local oscillator signal LO−, and outputs the sampled signal value to the output terminal OUT.

As set forth above, according to exemplary embodiments of the invention, a wideband receiver receives and performs low-pass filtering on a wideband input signal in the continuous-time domain, down-converts the wideband input signal, and performs low-pass filtering on the wideband input signal in the discrete-time domain. Therefore, a large number of PLLs and mixers are not required, so that the wideband receiver has a small area and consumes less power and can prevent harmonic mixing. Furthermore, since a down-conversion unit is operated in the discrete-time domain, the filtering characteristics of the down-conversion unit can be varied by changing the frequency of a clock required to operate the down-conversion unit.

While the present invention has been shown and described in connection with the exemplary embodiments, it will be apparent to those skilled in the art that modifications and variations can be made without departing from the spirit and scope of the invention as defined by the appended claims.

What is claimed is:

1. A wideband receiver comprising:
   an front-end unit configured to receive and perform low-pass filtering on a wideband input signal in a continuous-time domain, the front-end unit including at least one tunable low pass filter configured to perform low-pass filtering on the wideband input signal while changing a cutoff frequency according to a frequency of the wideband input signal; and
   a down-conversion unit configured to sample and hold an output signal of the front-end unit according to a local oscillator signal and perform low-pass filtering on the output signal in a discrete time domain,
   wherein the tunable low pass filter comprises:
   first and second resistors coupled in series between an input terminal and an output terminal;
   a first capacitor coupled to and disposed between a ground terminal and the output terminal;
   a second capacitor and an output resistor coupled in series between the ground terminal and a contact point of the first resistor and the second resistor; and
   a buffer coupled to and disposed between the output terminal and a contact point of the second capacitor and the output resistor.

2. The wideband receiver of claim 1, wherein the front-end unit further comprises:
   a wideband low-noise amplifier configured to receive and amplify the wideband input signal and located at a front of the at least one tunable low pass filer.

3. The wideband receiver of claim 1, wherein the buffer comprises an operational amplifier having a gain of 1, an input node of the operational amplifier being coupled to the output terminal.

4. The wideband receiver of claim 1, wherein the at least one tunable low pass filter changes the cutoff frequency by changing a device value of at least one of the first and second resistors and the first and second capacitors.

5. The wideband receiver of claim 1, wherein the at least one tunable low pass filter further comprises:

a first transistor of a first conductivity type, which has a gate coupled to the input terminal and a source to which a driving voltage is applied;

a second transistor of a second conductivity type, which has a gate and a drain coupled to a drain of the first transistor; and a third transistor of the first conductivity, which has a gate and a drain coupled to the output terminal and a source coupled to a driving voltage terminal.

6. The wideband receiver of claim 5, wherein the buffer includes a fourth transistor of the second conductivity type, which has a gate coupled to the first capacitor, a drain coupled to the drain of the third transistor, and a source coupled to the second capacitor.

7. The wideband receiver of claim 5, wherein the tunable low pass filter further comprises an additional output resistor coupled to and disposed between a source of the second transistor and the ground terminal.

8. The wideband receiver of claim 1, wherein the down-conversion unit comprises:
   a clock generator configured to generate a clock;
   a phase shifter configured to shift the clock with a phase difference of 90° to thereby generate the local oscillator signal required to restore an I/Q signal;
   two sample and hold circuits configured to sample and hold the output signal of the front-end unit according to the local oscillator signal in the discrete-time domain, down-convert the output signal of the front-end unit to baseband, and convert the output signal of the front-end unit into a signal in the discrete-time domain; and
   two discrete-time low pass filters configured to perform low-pass filtering on respective outputs of the two sample and hold circuits in the discrete-time domain.

9. The wideband receiver of claim 8, wherein each of the two sample and hold circuits comprises:
   a first transistor having a drain coupled to a first input terminal and a gate to which the local oscillator signal is input;
   a second transistor having a drain coupled to a second input terminal and a gate to which the local oscillator signal is input;
   a third transistor having a drain coupled to a source of the first transistor, a gate to which an inverted local oscillator signal is input, and a source coupled to an output terminal;
   a fourth transistor having a drain coupled to a source of the second transistor, a gate to which the inverted local oscillator signal is input, and a source coupled to a bias voltage;
   a fifth transistor having a drain coupled to the output terminal and a gate to which the local oscillation signal is input;
   a third capacitor coupled to and disposed between the source of the first transistor and the source of the second transistor;
   a fourth capacitor coupled to and disposed between the output terminal and a source of the fifth transistor; and
   a fifth capacitor coupled to and disposed between the fourth capacitor and the ground terminal.

10. The wideband signal of claim 9, wherein the two sample and hold circuits receive respective output signals of the front-end unit in the form of a differential signal pair through the first and second input terminals.

11. The wideband signal of claim 8, wherein the clock generator varies a frequency of the clock.

12. A wideband receiver, comprising:
    a front-end unit configured to receive and perform low-pass filtering on a wideband input signal in a continuous-time domain; and
    a down-conversion unit configured to sample and hold an output signal of the front-end unit according to a local oscillator signal and perform low-pass filtering on the output signal in a discrete time domain, the down-conversion unit including two sample and hold circuits configured to sample and hold the output signal of the front-end unit according to the local oscillator signal, down-convert the output signal of the front-end unit to baseband, and convert the output signal into a signal in the discrete-time domain,
    wherein each of the two sample and hold circuits comprises:
       a first transistor having a drain coupled to a first input terminal and a gate to which the local oscillator signal is input;
       a second transistor having a drain coupled to a second input terminal and a gate to which the local oscillator signal is input;
       a third transistor having a drain coupled to a source of the first transistor, a gate to which an inverted local oscillator signal is input, and a source coupled to an output terminal;
       a fourth transistor having a drain coupled to a source of the second transistor, a gate to which the inverted local oscillator signal is input, and a source coupled to a bias voltage;
       a fifth transistor having a drain coupled to the output terminal and a gate to which the local oscillator signal is input;
       a first capacitor coupled to and disposed between the source of the first transistor and the source of the second transistor;
       a second capacitor coupled to and disposed between the output terminal and a source of the fifth transistor; and
       a third capacitor coupled to and disposed between the second capacitor and a ground terminal.

13. The wideband signal of claim 12, wherein the two sample and hold circuits receive respective output signals of the front-end unit in the form of a differential signal pair through the first and second input terminals.

14. The wideband receiver of claim 12, wherein the down-conversion unit further comprises:
    a clock generator configured to generate a clock;
    a phase shifter configured to shift the clock with a phase difference of 90° to thereby generate the local oscillator signal required to restore an I/Q signal; and
    two discrete-time low pass filters configured to perform low-pass filtering on respective outputs of the two sample and hold circuits in the discrete-time domain.

15. The wideband receiver of claim 12 wherein the front-end unit comprises:
    a wideband low-noise amplifier configured to receive and amplify the wideband input signal; and
    at least one tunable low pass filter configured to perform low-pass filtering on the wideband input signal while changing a cutoff frequency according to a frequency of the wideband input signal.

16. The wideband receiver of claim 15, wherein the tunable low pass filter comprises:
    first and second resistors coupled in series between an input node and an output node of the tunable low pass filter;

a fourth capacitor coupled to and disposed between the ground terminal and the output node;

a fifth capacitor and an output resistor coupled in series between the ground terminal and a contact point of the first resistor and the second resistor; and a buffer coupled to and disposed between the output node and a contact point of the fifth capacitor and the output resistor.

* * * * *